United States Patent [19]
Schlesselmann et al.

[11] Patent Number: 5,477,173
[45] Date of Patent: Dec. 19, 1995

[54] ULTRA LOW POWER GAIN CIRCUIT (UGC)

[75] Inventors: John D. Schlesselmann, Santa Barbara; Kevin L. Pettijohn; William H. Frye, both of Goleta; Mary J. Hewitt, Santa Barbara, all of Calif.

[73] Assignee: Santa Barbara Research Center, Goleta, Calif.

[21] Appl. No.: 100,648

[22] Filed: Jul. 30, 1993

[51] Int. Cl.[6] .......................... H03K 17/687; H03K 3/353
[52] U.S. Cl. ........................... 327/111; 327/427; 327/560
[58] Field of Search ........................... 330/277; 307/246, 307/270, 571, 296.3, 480, 578, 353; 327/111, 108, 427, 434, 436, 437, 94, 91, 390, 544, 560, 562; 326/98, 93

[56] References Cited

U.S. PATENT DOCUMENTS

| | | | |
|---|---|---|---|
| 3,457,435 | 7/1969 | Burns et al. | 307/585 |
| 3,564,290 | 2/1971 | Sonoda | 307/578 |
| 3,838,293 | 9/1974 | Shah | 307/246 |
| 4,038,567 | 7/1977 | Lewis et al. | 307/270 |
| 4,491,748 | 1/1985 | Chappell et al. | 307/578 |

Primary Examiner—John S. Heyman
Assistant Examiner—Terry L. Englund
Attorney, Agent, or Firm—W. C. Schubert; W. K. Denson-Low

[57] ABSTRACT

An ultra low power gain circuit (UGC) implements a unique operational mode of a source follower circuit, and enables programmable gains greater than unity. A MOSFET has a gate terminal coupled to an input capacitance (Cin). A potential at a drain of the MOSFET is clocked to enable charge to flow through the channel. This charge charges a capacitor (Cout) that is connected to a source of the MOSFET. After charging Cout, the drain potential is restored to an initial value, and the charge on Cout discharges back through the MOSFET until the source voltage is one threshold drop from the gate potential, at which time the MOSFET turns off. Cout then stops discharging, and the final voltage appearing on Cout is a function of the magnitude of the gate voltage appearing on Cin. As the voltage at the source of the MOSFET changes, capacitive coupling, via (Cgs) to the gate, causes the gate voltage to also change. The value of the gate voltage determines a magnitude of a final voltage to which the source settles. A feedback effect is thereby produced which influences the voltage transfer function of the MOSFET. A minimum voltage gain is unity. However, through a selection of capacitor values for Cin and/or Cgs, a value of gain that is greater than unity can be achieved.

8 Claims, 2 Drawing Sheets

5,477,173

ULTRA LOW POWER GAIN CIRCUIT (UGC)

FIELD OF THE INVENTION

This invention relates generally to integrated circuitry and, in particular, to a low power buffer amplifier integrated circuit.

BACKGROUND OF THE INVENTION

Low power circuitry, including amplifiers and buffer amplifiers, find utility in a number of applications, including battery operated equipment and in applications wherein the overall circuit volume must be small.

One particularly useful application for low power circuitry is in providing readout circuits for an array of radiation detectors that are cooled to cryogenic temperatures during operation. The readout circuits are preferably fabricated in integrated circuit form, and typically include analog signal switching elements and amplifiers. In such assemblies it is often desirable to locate the integrated circuit readout at or near to a focal plane array (FPA) of cryogenically cooled radiation detectors, such as those comprised of Group II-VI semiconductor material and optimized for detecting infrared (IR) radiation.

In such applications it is known to hybridize the FPA with the readout integrated circuit through the use of indium bump technology. This serves to minimize the lengths of interconnections between the FPA and the readout circuitry, which in turn reduces parasitic capacitance, reduces electrical noise, and increases the speed of operation.

It can be appreciated that when locating the readout integrated circuit at or near the cryogenically cooled focal plane, it is important to minimize the operating power consumption of the readout integrated circuit to avoid placing a large heat load removal requirement on the cryogenic cooler assembly. Another important aspect of power reduction is to reduce as much as possible a quiescent power consumption of the circuitry.

Another important consideration is to provide readout circuitry that is amenable to a simplified construction. This tends to increase the density with which such circuits can be integrated upon a common substrate, and furthermore tends to increase the overall reliability of the FPA/readout assembly.

A conventional circuit for providing isolation between two stages of circuitry is the source follower. However, the conventional source follower does not provide gain and, in fact, typically introduces an undesired attenuation to a signal propagating between two stages of circuitry. That is, the conventional source follower is not a true unity gain circuit. The conventional source follower also requires a current source for operation (thereby consuming significant power even in a quiescent state), and has a slew-limited response speed that is, in part, determined by the required current source.

Buffer stages have also been constructed using operational amplifiers in a closed loop configuration. While these circuits exhibit good drive capability, they are generally complex and require relatively higher power to operate than the conventional source follower.

It is thus an object of this invention to provide a low power amplifier circuit that overcomes the problems of the prior art.

It is another object of this invention to provide a buffer amplifier circuit suitable for fabrication on an integrated circuit, the buffer amplifier circuit featuring programmable gains that may exceed unity, a negligible quiescent power dissipation, and an improved response speed over conventional circuitry.

SUMMARY OF THE INVENTION

The problems discussed above are overcome and the objects of the invention are fulfilled by an ultra low power gain circuit (UGC) that is constructed and operated in accordance with the invention. The UGC may function as a buffer amplifier to isolate two stages of circuitry, or as a preamplifier having an input coupled to an output of a photodetector. The UGC implements a unique operational mode of a source follower circuit, and enables programmable gains greater than unity.

A potential at a drain of a Metal Oxide Semiconductor Field Effect Transistor (MOSFET) is clocked to enable charge to flow through a channel that lies under a gate terminal of the MOSFET. This charge charges an output capacitance connected to a source terminal of the MOSFET. After charging the output capacitance, the drain potential is restored to an initial value, and the charge on the output capacitance discharges back through the MOSFET until the voltage at the source is one threshold drop from the gate potential, at which time the MOSFET turns off. The gate potential is preferably supplied from an input capacitance. When the MOSFET turns off the output capacitance stops discharging, and a voltage then appearing on the output capacitance is a function of the magnitude of the gate voltage supplied from the input capacitance.

As the voltage at the source of the MOSFET changes due to the discharging of the output capacitance, capacitive coupling between the source and the gate causes the gate voltage to also change. The value of the gate voltage thus determines a magnitude of a final voltage to which the output capacitance settles. A feedback effect is thereby produced which influences the voltage transfer function of the MOSFET. A minimum voltage gain is unity. However, through a selection of capacitance values, a value of gain that is greater than unity can be achieved.

In that a constant current source is not required to be connected to the source terminal of the MOSFET, as in the conventional source follower, there is substantially no quiescent power dissipation. Also, in that the speed of the UGC is limited only by the on-impedance of the MOSFET, operation of the UGC is typically faster than the conventional source follower, which has a slew limited response.

As was stated, the UGC provides buffering and amplification with no substantially quiescent power dissipation. The only power consumed by the UGC is during the clocking of the MOSFET.

The UGC can be fabricated within a small area of an integrated circuit. The UGC can also be designed to have a unity gain, or a greater than unity gain, through a proper choice of capacitor ratios. Like the conventional source follower, the UGC provides a dc offset to the output signal of approximately one device threshold.

BRIEF DESCRIPTION OF THE DRAWINGS

The above set forth and other features of the invention are made more apparent in the ensuing Detailed Description of the Invention, when read in conjunction with the attached Drawings, wherein.

DETAILED DESCRIPTION OF THE INVENTION

Figure 1:
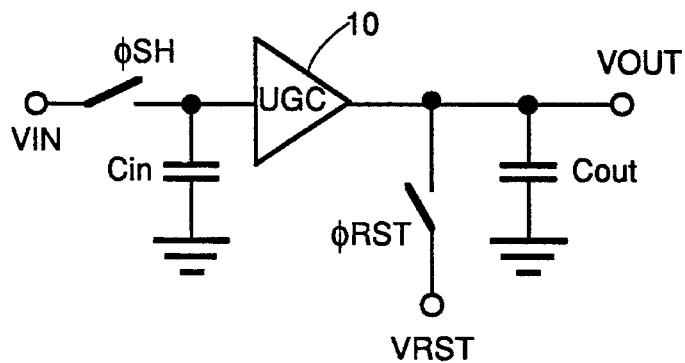
FIG. 1 is a block diagram of the UGC and associated switches and capacitors.
Figure 2:
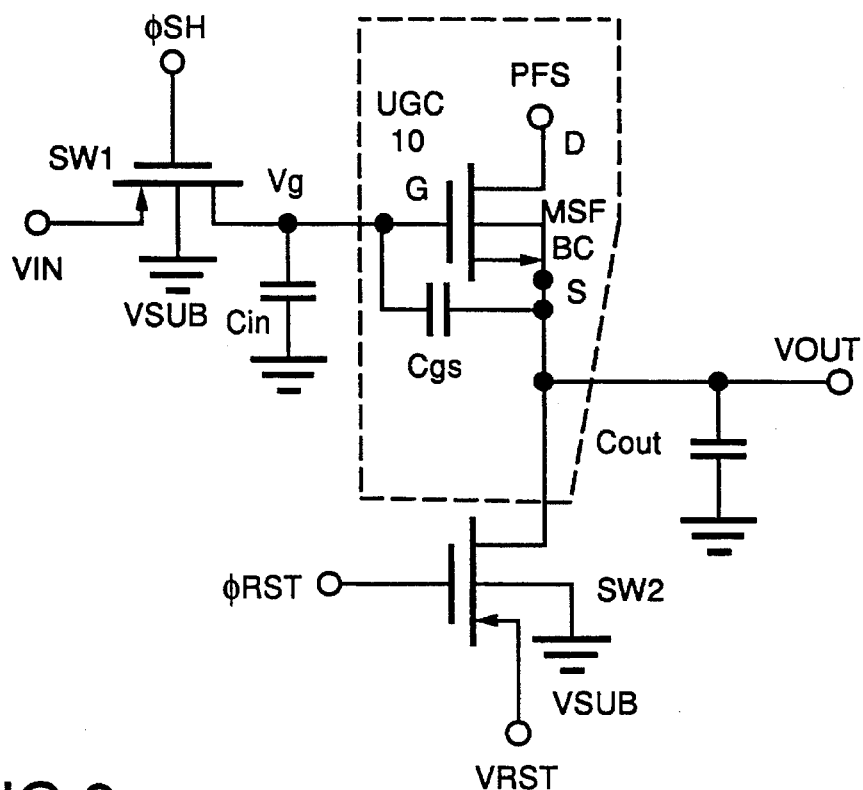
FIG. 2 is a schematic diagram of the UGC and the associated components depicted in FIG. 1.
Figure 4:
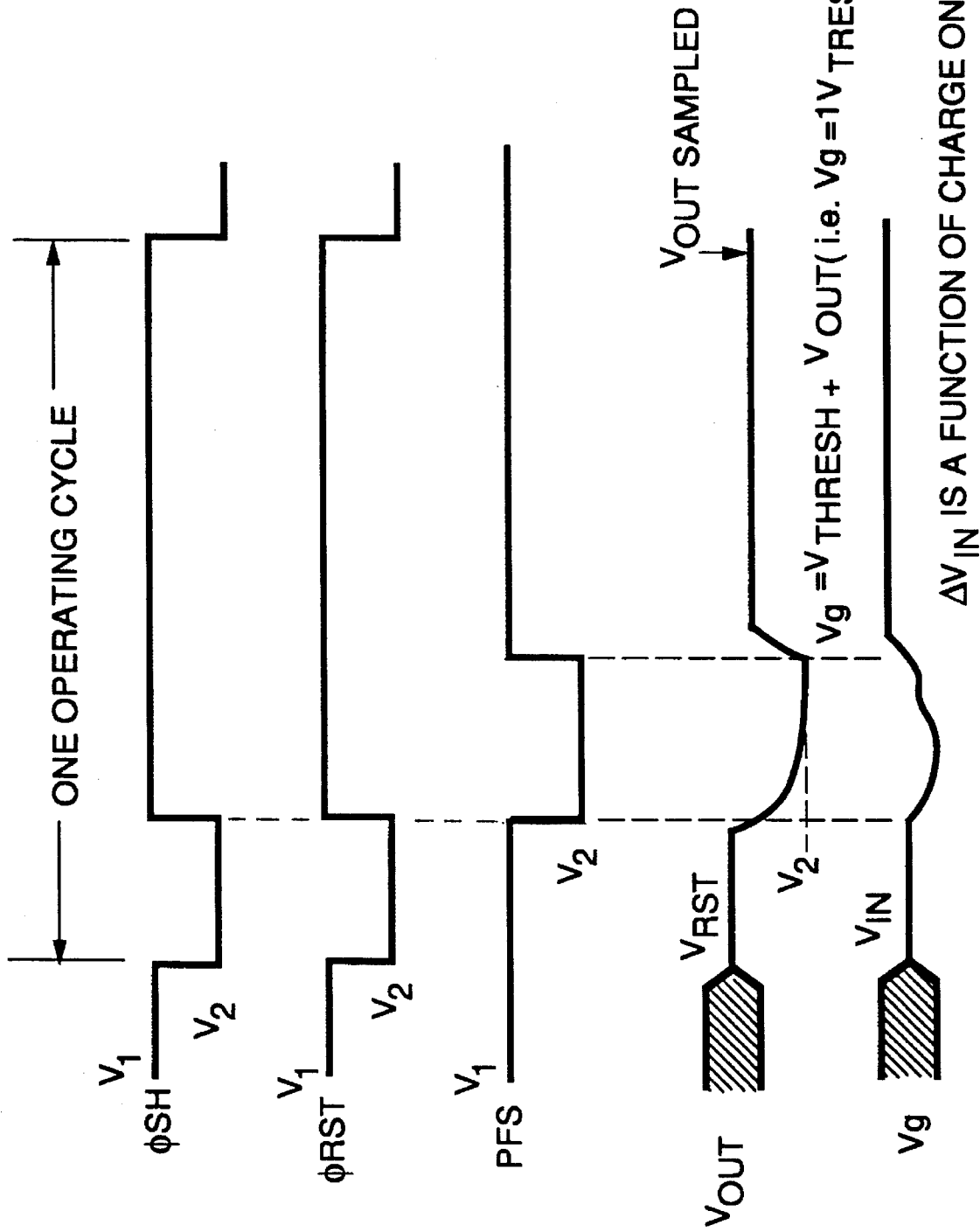
FIG. 4 is a timing diagram that illustrates the operation of the UGC and associated circuitry.

Referring to FIGS. 1 and 2, in combination with the timing diagram of FIG. 4, the UGC 10 includes an n-channel MOSFET source follower (MSF) having source (S), drain (D), and gate (G) terminals. An input signal VIN is sampled by a switch SW1 during a sampling time dictated by a duration of a timing signal φSH (phi sample and hold). Simultaneously, timing signal φRST (phi reset) is applied to SW2 to couple the source terminal to a voltage VRST, thereby resetting an output capacitance (Cout) to a known potential at the beginning of an operating cycle. SW1 and SW2 are both implemented in a conventional manner as p-channel MOSFETs. The potential VSUB is a substrate potential.

The sampled input signal is held on an input capacitance (Cin) and provides a gate voltage potential (Vg) to the gate of MSF. The drain of the n-channel MOSFET source follower MSF is then pulsed from V1 to V2 with a clocked voltage source (PFS). This places the MSF in a linear mode of operation and causes the channel of MSF to assume a very low impedance. The source of MSF, which is also connected to the capacitance Cout, then charges to approximately the same voltage (PFS) as the drain.

PFS is then pulsed back to a higher voltage (V1). The source of MSF will initially follow this change in voltage from V2 to V1 as Cout discharges through MSF. Capacitive coupling from the source and drain to the gate, due in part to Cgs, causes a proportional change in potential at the gate of MSF. Overall, the gate voltage change is smaller than the source voltage change, and the gate-to-source voltage difference tends to decrease. The MSF eventually turns off when the gate-to-source voltage (Vgs) falls below the MOSFET threshold voltage (VTHRESH), and the source of MSF is then isolated from any further voltage change. The source voltage at which this occurs is a function of the gate voltage, hence the term source follower (SF).

One unique feature of the UGC 10 is the capacitive feedback provided by Cgs, which may be only the inherent parasitic capacitance of MSF, or the parasitic capacitance augmented with an additional capacitance. If VIN is driven by a voltage source that is not affected by the capacitive coupling, then the UGC 10 turns off when the source voltage reaches Vg−VTHRESH. In this case, the gain of the circuit is ideally unity.

However, when VIN is produced by charge stored on Cin, as shown in FIGS. 1 and 2, then coupling across MSF causes the gate voltage to vary, which in turn influences the final voltage at the source. This variation, in combination with the capacitance values of Cin and Cgs, can provide a gain of greater than unity.

The UGC 10 may thus be viewed as an amplifier with a feedback network comprised of Cgs, the gate-to-source capacitance of the MSF.

Figure 3:
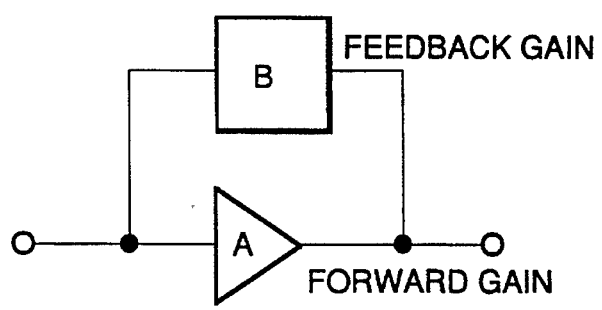
FIG. 3 is a block diagram illustrating the feedback effect that is a feature of the operation of the UGC.

From feedback theory, the closed loop gain (Acl) is found by the following equation:

$$Acl = \frac{A}{1-AB}$$

where A is the forward gain with no feedback, and B is the gain of the feedback network. Reference is also made to FIG. 3.

For the circuit shown in FIG. 2, A=1, since the source of the MOSFET MSF will follow the gate voltage with an offset equal to VTHRESH. The feedback gain, B, is evaluated to be:

$$B = \frac{Cgs}{Cin + Cgs}.$$

The closed loop gain (Acl) then becomes:

$$Acl = \frac{1}{1 - \frac{Cgs}{Cin + Cgs}} = \frac{Cin + Cgs}{Cin},$$

or $$Acl = 1 + \frac{Cgs}{Cin}.$$

It is evident from this result that gains of greater than unity can be readily achieved with the UGC 10 by varying the ratio of Cin and Cgs. The case of approximately unity gain is achieved by selecting a large value of Cin relative to Cgs.

The circuitry of FIG. 2 has been fabricated using a double metal, double polysilicon CMOS process. An n-type Si substrate has a p-well formed therein, and a polysilicon gate electrode is formed across the p-well for defining an underlying channel region. N-type diffusions are made on each side of the gate electrode for forming the source and the drain regions. A suitable potential applied to the gate electrode inverts the underlying p-material to n-type, resulting in the MOSFET MSF functioning as an n-channel MOSFET device. The bulk connection (BC) is made to the n-type diffusion that is intended to function as the source of the MOSFET.

Exemplary voltage and component values for the UGC 10 are as follows:

V1=0 volts;

V2=−6 volts;

VSUB=0 volts;

VTHRESH≈1 volt at 77K;

Cout=200 femtofarads; and

Cin=200 femtofarads (for a gain of ≈1); with

Cgs on the order of 10's of femtofarads, with 30 femtofarads being a typical value for the intrinsic parasitic capacitance between the gate and the source.

In FIG. 4, and for an exemplary operating cycle time of one microsecond, a suitable width for φSH, φRST, and PFS is approximately 200 nanoseconds. This leaves approximately 600 nanoseconds of settling time before VOUT is readout to a next stage.

The UGC 10 can be employed to advantage within a unit cell of a readout integrated circuit to function as a low noise preamplifier, in a similar manner as a source follower per detector (SFD) architecture, but with the important advantages that the UGC 10 offers over a conventional source follower. In this embodiment, VIN can be received directly from an output of a photodetector. The UGC 10 can also be employed to advantage as part of a Charge Coupled Device (CCD) output to sense a signal and provide gain. The UGC 10 can also be employed between circuit stages to provide buffering only (Acl=1) or buffering with gain (Acl>1).

It should be realized that modifications can be made to the embodiment of the invention that is described above. For example, SW1 can be deleted and Cin coupled directly to VIN. However, if a gain greater than unity is desired, then SW1 is required to isolate Cin from the input source potential, thereby enabling the potential appearing on Cin, and hence Vg, to be varied by the feedback action of Cgs. Furthermore, the MSF can be implemented as a p-channel device. Also, the construction of the UGC 10 can be accomplished in other than a Si substrate.

Thus, while the invention has been particularly shown and described with respect to a preferred embodiment thereof, it will be understood by those skilled in the art that changes in form and details may be made therein without departing from the scope and spirit of the invention.

What is claimed is:

1. A circuit having an input and an output, the circuit comprising:

a transistor device having a first terminal, a second terminal, and a control terminal;

an input capacitance having a node coupled to said control terminal and to the input of the circuit, said input capacitance being capable of having an input voltage potential impressed thereon;

an output capacitance having a node coupled to said first terminal and to the output of the circuit;

applying means, coupled to said second terminal, for selectively applying a first predetermined potential to said second terminal followed by a second predetermined potential, the application of said first predetermined potential causing said output capacitance to charge to a potential that is approximately equal to the first predetermined potential, the application of said second predetermined potential causing said output capacitance to begin discharging through said transistor device;

reset switch means for selectively coupling and uncoupling said node of said output capacitance to a predetermined reset potential, wherein said reset switch means couples and uncouples said node of said output capacitance to the predetermined reset potential prior to said applying means applying the first predetermined voltage potential to said second terminal; and capacitive feedback means, coupled between said first terminal and said control terminal, for coupling to said control terminal a change in the potential that occurs at said output capacitance due to said applying means applying said second predetermined potential to said second terminal, whereby a voltage transfer function of said transistor is varied.

2. A circuit as set forth in claim 1, and further comprising input switch means for selectively coupling and uncoupling said node of said input capacitance to a source of said input voltage potential.

3. An amplifier circuit, comprising:

a transistor device having a source terminal, a drain terminal, and a gate terminal;

an input capacitance Cin having a node coupled to said gate terminal;

an output capacitance Cout having a node coupled to said source terminal;

reset switch means for selectively coupling and uncoupling said node of said output capacitance to a predetermined reset potential;

applying means, coupled to said drain terminal, for selectively applying a first predetermined potential to said drain terminal followed by a second predetermined potential, said applying means applying said first predetermined potential during a time that said reset switch means has uncoupled said node of said output capacitance from said reset potential, the application of said first predetermined potential causing said output capacitance to charge to a potential that is approximately equal to the first predetermined potential, the application of said second predetermined potential causing said output capacitance to begin discharging through said transistor device; and a capacitance (Cgs) coupled between said source terminal and said gate terminal, said Cgs capacitance coupling to said gate terminal a change in the potential that occurs at said output capacitance due to said applying means applying said second predetermined potential to said drain terminal, wherein a closed loop gain Acl of said transistor is given by:

$$Acl = 1 + \frac{Cgs}{Cin}.$$

4. A circuit as set forth in claim 3, and further comprising a source of input voltage potential; and input switch means for selectively coupling and uncoupling said node of said input capacitance to said source of input voltage potential.

5. A circuit as set forth in claim 4 wherein said input switch means selectively couples and uncouples said node of said input capacitance to an output of a photodetector.

6. A method of operating an amplifier circuit, comprising the steps of:

providing an amplifier circuit that includes a transistor device having a source terminal, a drain terminal, a gate terminal, and a capacitance Cgs that is coupled between the gate terminal and the source terminal, the amplifier circuit further including an input capacitance Cin having a node coupled to the gate terminal and an output capacitance Cout having a node coupled to the source terminal;

during a first time period, coupling the node of Cin to an input voltage potential while coupling the node of Cout to a reset voltage potential;

during a second time period, storing the input voltage potential on the node of Cin by uncoupling the node of Cin from the input voltage potential;

uncoupling the node of Cout from the reset voltage potential; and coupling the drain of the transistor device to a first voltage potential and charging the node of Cout to approximately the first voltage potential;

during a third time period, coupling the drain of the transistor device to a second voltage potential and beginning the discharging Cout to the second voltage potential while also capacitively coupling to the gate terminal, through Cgs, a change in potential due to the discharging of Cout, the voltage potential at the gate terminal continuing to change until a difference in potential between the gate terminal and the source terminal is less than a threshold voltage of the transistor; and terminating the discharging of Cout by turning off the transistor when the difference in voltage potential between the gate terminal and the source terminal is less than the threshold voltage of the transistor, whereby a voltage potential then appearing at the node of Cout is a function of the voltage potential then appearing at the gate terminal.

7. A method as set forth in claim 6, wherein a magnitude of the capacitance of Cin is substantially larger than a magnitude of the capacitance of Cgs, and wherein the voltage potential then appearing at the node of Cout is approximately equal to the voltage potential then appearing at the gate terminal.

8. A method as set forth in claim 6, wherein the voltage potential then appearing at the node of Cout is greater than the voltage potential then appearing at the gate terminal by a gain factor, and wherein the gain factor is equal to unity plus a result of a division of the magnitude of the capacitance of Cgs by the magnitude of the capacitance of Cin.

* * * * *

UNITED STATES PATENT AND TRADEMARK OFFICE
CERTIFICATE OF CORRECTION

PATENT NO. : 5,477,173

DATED : December 19, 1995

INVENTOR(S) : John D. Schlesselmann, Kevin L. Pettijohn, William H. Frye, Mary J. Hewitt It is certified that error appears in the above-identified patent and that said Letters Patent is hereby corrected as shown below:

Column 1, after the title , insert the following:

This invention was made with Government Support under Contract No. DASG60-90-C-00128 awarded by the United States Army. The Government has certain rights in this invention.

Signed and Sealed this

Twenty-fifth Day of February, 1997

Attest:

BRUCE LEHMAN

*Attesting Officer*  *Commissioner of Patents and Trademarks*